US010642440B2

(12) United States Patent
Tung et al.

(10) Patent No.: US 10,642,440 B2
(45) Date of Patent: May 5, 2020

(54) TOUCH BUTTON WITH BETTER FEEL IN PRESSING

(71) Applicant: CONCRAFT HOLDING CO., LTD., New Taipei (TW)

(72) Inventors: Chang-Hsien Tung, New Taipei (TW); Zheng-Xiang Wang, Kunshan (CN)

(73) Assignee: CONCRAFT HOLDING CO., LTD, New Taipei (TW)

( * ) Notice: Subject to any disclaimer, the term of this patent is extended or adjusted under 35 U.S.C. 154(b) by 0 days.

(21) Appl. No.: 16/031,530

(22) Filed: Jul. 10, 2018

(65) Prior Publication Data
US 2019/0302933 A1    Oct. 3, 2019

(30) Foreign Application Priority Data

Mar. 30, 2018 (TW) .............................. 107111256 A

(51) Int. Cl.
| *H01H 13/702* | (2006.01) |
| *G06F 3/045* | (2006.01) |
| *G06F 3/0354* | (2013.01) |
| *H01H 13/7073* | (2006.01) |
| *H03K 17/96* | (2006.01) |
| *G06F 1/16* | (2006.01) |

(52) U.S. Cl.
CPC .......... *G06F 3/045* (2013.01); *G06F 3/03547* (2013.01); *H01H 13/7073* (2013.01); *G06F 1/1662* (2013.01); *H03K 17/9645* (2013.01)

(58) Field of Classification Search
CPC .... G06F 1/1662; G06F 3/03547; G06F 3/045; H01H 13/14; H01H 13/48; H01H 13/52; H01H 13/702; H01H 13/703; H01H 13/704; H01H 13/705; H01H 13/7073; H01H 13/13; H01H 13/785; H01H 25/041; H01H 2201/032; H01H 2209/002; H01H 2209/074; H01H 2217/01; H01H 2221/03; H01H 2233/07; H01H 2235/008; H03K 17/9645
See application file for complete search history.

(56) References Cited

U.S. PATENT DOCUMENTS

| 2,870,108 A | * | 1/1959 | Nickerson | ............... C07F 7/025 |
| | | | | 524/261 |
| 4,500,758 A | * | 2/1985 | Guckenheimer | .... H01H 13/702 |
| | | | | 200/5 A |
| 5,152,392 A | * | 10/1992 | Iwasa | ................... H01H 13/705 |
| | | | | 200/329 |
| 5,573,107 A | * | 11/1996 | Nakano | ................ H01H 13/702 |
| | | | | 200/311 |

(Continued)

Primary Examiner — Michael J Eurice
(74) Attorney, Agent, or Firm — Muncy, Geissler, Olds & Lowe, PC

(57) ABSTRACT

A touch button with better feel in pressing is disposed on a casing, including a touch board having a touch area and a press area, a fixing element disposed on a side of the touch board to form a difference in height from the touch board, an elastic connector for connecting the touch board with the fixing element and forming a state of elastic vertical displacement between the press area and the casing, and plural elastic supporters forming an elastic supporting force to the press area, thereby enabling the press area to manifest the state of elastic vertical displacement on the casing by the elastic supporting force.

12 Claims, 6 Drawing Sheets

(56) References Cited

U.S. PATENT DOCUMENTS

| | | | | |
|---|---|---|---|---|
| 5,718,326 A * | 2/1998 | Larose | ............... | H01H 13/14 200/314 |
| 5,841,088 A * | 11/1998 | Yamaguchi | ............ | H01H 9/302 218/158 |
| 5,909,804 A * | 6/1999 | Kuratani | ............... | H01H 13/705 200/406 |
| 6,355,890 B1 * | 3/2002 | Kuroda | ................. | H01H 13/70 200/345 |
| 6,359,242 B1 * | 3/2002 | Maple | ................. | H01H 13/702 200/292 |
| 6,765,158 B1 * | 7/2004 | Morrison | ............... | H01H 13/70 200/341 |
| 10,102,985 B1 * | 10/2018 | Pelletier | ................ | H01H 13/06 |
| 10,347,443 B1 * | 7/2019 | Wu | ......................... | H01H 13/83 |
| 2002/0084986 A1 * | 7/2002 | Armstrong | ........... | G06F 3/03543 345/163 |
| 2002/0097224 A1 * | 7/2002 | Nishino | ................ | G05G 9/047 345/161 |
| 2003/0116414 A1 * | 6/2003 | Maeda | ................. | H01H 25/041 200/56 R |
| 2003/0132507 A1 * | 7/2003 | Odaira | ................ | H01H 13/702 257/620 |
| 2004/0002356 A1 * | 1/2004 | Honda | ................. | G06F 3/0338 455/550.1 |
| 2004/0200699 A1 * | 10/2004 | Matsumoto | ............ | H01H 13/702 200/1 B |
| 2004/0238710 A1 * | 12/2004 | Hsu | ....................... | G06F 1/1613 248/346.03 |
| 2004/0253867 A1 * | 12/2004 | Matsumoto | ........... | H01H 1/5805 439/500 |
| 2005/0000788 A1 * | 1/2005 | Nishimura | ............ | H01H 13/702 200/512 |
| 2005/0012730 A1 * | 1/2005 | Niitsuma | ................ | A63F 13/06 345/204 |
| 2005/0224326 A1 * | 10/2005 | Oikawa | ................ | H01H 13/063 200/302.1 |
| 2005/0264530 A1 * | 12/2005 | Takatsuka | ............. | G06F 3/0338 345/160 |
| 2006/0042924 A1 * | 3/2006 | Ito | ......................... | H01H 13/785 200/512 |
| 2006/0267937 A1 * | 11/2006 | Takatsuka | ........... | G06F 3/03548 345/160 |
| 2006/0284710 A1 * | 12/2006 | Takatsuka | ............. | G06F 3/0202 335/205 |
| 2007/0045095 A1 * | 3/2007 | Nakanishi | ............ | H01H 13/705 200/512 |
| 2007/0051603 A1 * | 3/2007 | Hakunti | ............... | H01H 13/702 200/310 |
| 2007/0068783 A1 * | 3/2007 | Kim | ..................... | G06F 3/0202 200/310 |
| 2007/0084710 A1 * | 4/2007 | Koyano | ................. | H01H 9/52 200/341 |
| 2007/0125629 A1 * | 6/2007 | Senzui | ................. | H01H 13/704 200/5 A |
| 2007/0199811 A1 * | 8/2007 | Hotta | .................... | H01H 35/02 200/310 |
| 2007/0199814 A1 * | 8/2007 | Kobayashi | .............. | B29C 45/14 200/520 |
| 2007/0257886 A1 * | 11/2007 | Uotani | ................... | G06F 3/0338 345/160 |
| 2007/0272534 A1 * | 11/2007 | Iohara | ................... | H01H 13/704 200/512 |
| 2007/0292186 A1 * | 12/2007 | Lane | .................... | G06F 3/0202 400/495 |
| 2007/0298828 A1 * | 12/2007 | Begic | .................. | H04M 1/0202 455/550.1 |
| 2008/0093961 A1 * | 4/2008 | Koyano | .................. | H01H 9/52 313/11 |
| 2008/0277253 A1 * | 11/2008 | Kenmochi | ......... | H01H 13/7006 200/314 |
| 2009/0107816 A1 * | 4/2009 | Chen | ...................... | H01H 13/83 200/314 |
| 2009/0133997 A1 * | 5/2009 | Kato | ...................... | H01H 13/88 200/293 |
| 2009/0148219 A1 * | 6/2009 | Odell | ..................... | B29C 45/006 400/491 |
| 2009/0236209 A1 * | 9/2009 | Ishii | ...................... | H01H 13/705 200/341 |
| 2009/0277765 A1 * | 11/2009 | Inagaki | .............. | H01H 13/7065 200/341 |
| 2009/0277766 A1 * | 11/2009 | Fujitsuna | ............. | H01H 13/85 200/342 |
| 2010/0232861 A1 * | 9/2010 | Shibata | ................ | G06F 1/1662 400/491 |
| 2011/0028919 A1 * | 2/2011 | Johnnison | ......... | A61F 13/00068 604/319 |
| 2011/0107958 A1 * | 5/2011 | Pance | ..................... | G06F 3/016 116/205 |
| 2012/0092263 A1 * | 4/2012 | Peterson | ................ | G06F 3/016 345/168 |
| 2012/0193207 A1 * | 8/2012 | He | .......................... | G06F 21/83 200/5 A |
| 2012/0227251 A1 * | 9/2012 | Hyuga | ............... | B29C 45/14467 29/622 |
| 2013/0043115 A1 * | 2/2013 | Yang | ..................... | G06F 1/1662 200/5 A |
| 2013/0050919 A1 * | 2/2013 | Matsui | .................... | H04M 1/18 361/679.01 |
| 2013/0270081 A1 * | 10/2013 | Wu | ......................... | H01H 13/14 200/314 |
| 2014/0071056 A1 * | 3/2014 | Liu | ....................... | G06F 1/1626 345/169 |
| 2014/0375271 A1 * | 12/2014 | Wang | .................... | H02J 7/0044 320/115 |
| 2015/0090570 A1 * | 4/2015 | Kwan | ...................... | B05D 5/06 200/5 A |
| 2015/0340176 A1 * | 11/2015 | Wu | ......................... | H01H 13/14 200/5 A |
| 2018/0164938 A1 * | 6/2018 | Li | ............................ | H03K 17/97 |
| 2018/0190445 A1 * | 7/2018 | Ito | .......................... | H01H 13/14 |
| 2018/0218856 A1 * | 8/2018 | Ito | .......................... | H01H 13/14 |
| 2018/0218859 A1 * | 8/2018 | Ligtenberg | ......... | G06K 9/00375 |
| 2018/0275769 A1 * | 9/2018 | Ikeda | .................... | H04M 1/185 |
| 2019/0107447 A1 * | 4/2019 | Ebisui | ................... | H01H 13/00 |

\* cited by examiner

TOUCH BUTTON WITH BETTER FEEL IN PRESSING

BACKGROUND OF THE INVENTION a) Field of the Invention

The present invention relates to a touch button and more particularly to a touch button which is applied to a laptop computer, with better feel in pressing.

b) Description of the Prior Art

The existing laptop computers have been developed gradually toward miniaturization. Therefore, to save the entire space of and improve the convenience in using the laptop computers, most of the laptop computers are provided with a touch panel, and two touch buttons will be formed next to each other on a lower rim of the touch panel area to replace the left and right button on a mouse.

For this kind of touch button, a metallic spring plate is disposed below the touch button to achieve an elastic state where the touch button displaces vertically; therefore, when the touch button is pressed down, elastic deformation will be formed to the metallic spring plate, which results in sound from the metallic spring plate and also makes the feel in pressing stiffer.

Accordingly, the technical means and the object thereof to be solved by the present invention are the provision of a touch button with better feel in pressing and with improvement to the problem of making sound when the touch button is pressed down.

SUMMARY OF THE INVENTION

The primary object of the present invention is to provide a touch button and more particularly to a touch button which is applied to a laptop computer, with better feel in pressing.

To achieve the aforementioned object, the present invention discloses a touch button with better feel in pressing, which is disposed on a casing and comprises a touch board, at least a fixing element, at least an elastic connector and at least an elastic supporter. The touch board is provided with a touch area and at least a press area adjacent the touch area. The fixing element is disposed on a side of the touch board, forming a difference in height from the touch board to fix the touch board on the casing. In addition, a gap is formed between the fixing element and the casing. The elastic connector is used to connect the touch board with the fixing element, and is provided with a first connecting portion which is connected with the touch board, a second connecting portion which is connected with the fixing portion, and an elastic connecting portion which is connected between the first connecting portion and the second connecting portion to form the difference in height between the touch board and the fixing element, so that a state of elastic vertical displacement can be manifested between the press area and the casing by the elastic connecting portion. The plural elastic supporters are disposed in the press area of the touch board, and each elastic supporter includes a positioning portion which is fixed on the touch board and an elastic portion which is extended from the positioning portion toward the casing to be disposed in the gap. An elastic supporting force is formed to the press area by the elastic portion, allowing the press area to form the state of elastic vertical displacement on the casing by the elastic supporting force.

In an embodiment, the positioning portion of each elastic supporter is interconnected with the first connecting portion of the elastic connector.

In an embodiment, each elastic connector and each elastic supporter are made of an elastic material.

In an embodiment, the fixing element further includes a first board piece and a second board piece which is separated from the first board piece. In addition, the touch board is disposed between the first board piece and the second board piece, and the first board piece and the second board piece are interconnected respectively with the touch board by the elastic connector.

In an embodiment, the press area of the touch board is adjacent the first board piece.

In an embodiment, the press area is provided with plural positioning holes, and each positioning portion of the elastic supporter is disposed in the positioning hole.

In an embodiment, the elastic portion of each elastic supporter is a hollow cone.

In an embodiment, each elastic supporter further includes a limiting portion which is extended from the positioning portion toward the casing, and the elastic portion is annularly disposed on a periphery of the limiting portion.

In an embodiment, each elastic portion of the elastic supporter is a cylinder.

In comparison to the prior arts, the touch button with better feel in pressing, according to the present invention, is provided with following advantages.

In the present invention, the elastic connector and the elastic supporter are all formed between the touch board and the fixing element by elastic silica gel; therefore, when the touch board displaces up and down elastically, the feel in pressing can be improved, which solves the problem of the prior arts that the feel in pressing is stiffer by the metallic spring plate, and avoids resulting in sound of metal when the touch button is being pressed down.

To enable a further understanding of said objectives and the technological methods of the invention herein, a brief description of the drawings is provided below followed by a detailed description of the preferred embodiments.

DETAILED DESCRIPTION OF THE PREFERRED EMBODIMENTS

Figure 1:
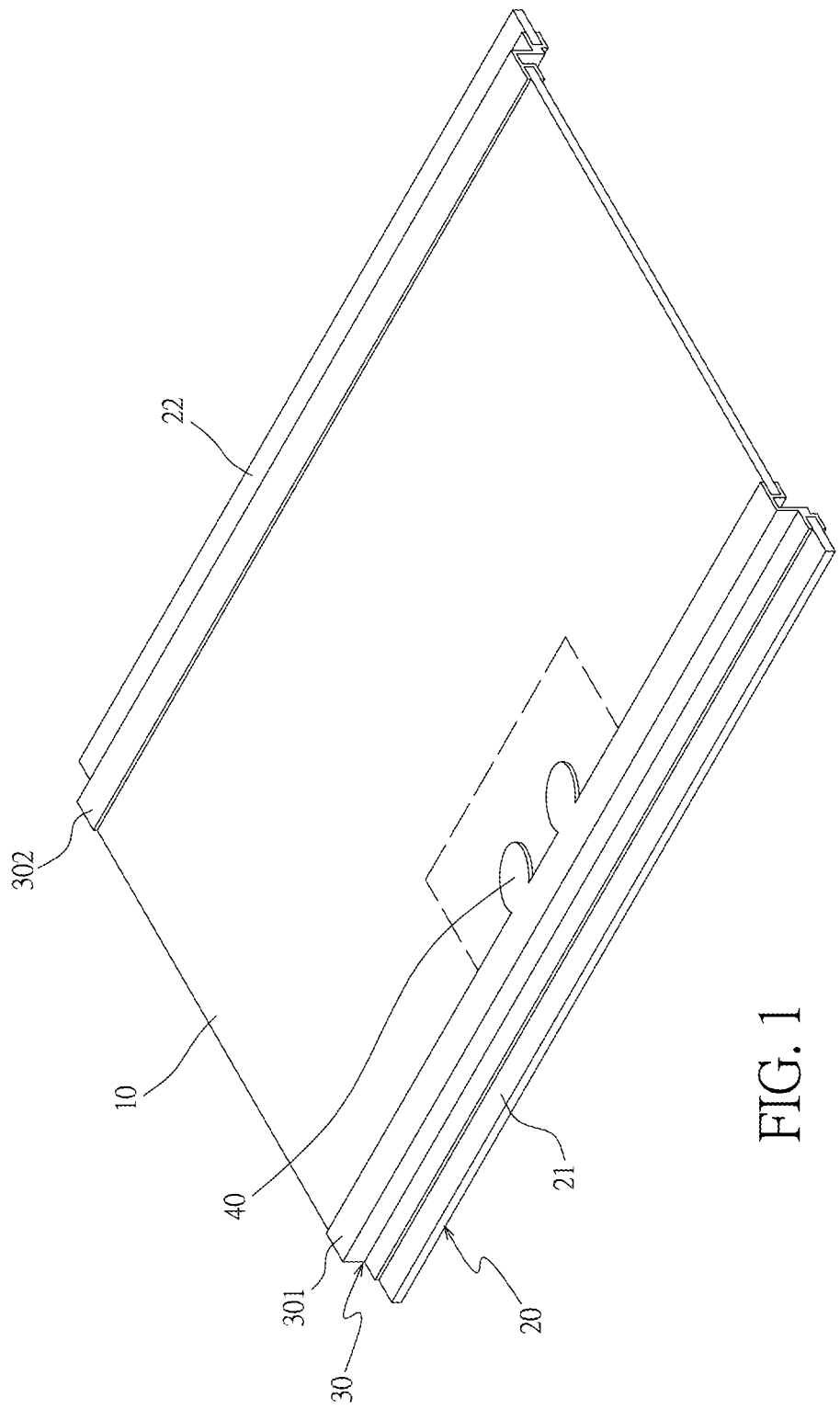
FIG. 1 shows a perspective view of a first mode of the present invention.

Referring to FIGS. 1 to 4, it shows a first mode provided by the present invention which discloses a touch button with better feel in pressing, comprising a touch board 10, at least a fixing element 20, at least an elastic connector 30 and plural elastic supporters 40.

Specifically, the touch board 10 is provided with a touch area 11 and at least a press area 12 adjacent the touch area 11. The touch board 10 is formed integrally by a metallic material or a plastic material. In the present embodiment, the fixing element 20 includes a first board piece 21 and a second board piece 22 which is separated from the first board piece 21, and the touch board 10 is disposed between the first board piece 21 and the second board piece 22. In addition, a difference in height is formed between the touch board 10 and the first board piece 21, as well as between the touch board 10 and the second board piece 22. Besides that, the press area 12 is disposed on the touch board 10 adjacent the first board piece 21. The elastic connector 30 is used to connect the touch board 10 with the fixing element 20. In the present embodiment, a first elastic connector 301 is disposed between the touch board 10 and the first board piece 21, and a second elastic connector 302 is disposed between the touch board 10 and the second board piece 22. Each elastic connector 30 includes a first connecting portion 31 which is used to connect the touch board 10, a second connecting portion 32 which connects the fixing element 20, and an elastic connecting portion 33 which is connected between the first connecting portion 31 and the second connecting portion 32. The elastic connecting portion 33 is extended in a longitudinal direction, and the first connecting portion 31 and the second connecting portion 32 are disposed respectively on each end of the elastic connecting portion 33 to extend transversally in a reverse direction, forming the difference in height between the touch board 10 and the fixing element 20. The elastic supporter 40 is disposed in the press area 12 of the touch board 10. In the present embodiment, the press area 12 is provided with two elastic supporters 40, and each elastic supporter 40 includes a positioning portion 41 which is fixed on the touch board 10, and an elastic portion 42 which is extended from the positioning portion 41. In addition, each elastic supporter 40 is disposed in the difference in height formed between the touch board 10 and the fixing element 20. In the present embodiment, each elastic supporter 40 further includes a limiting portion 43 which is extended from the positioning portion 41, the limiting portion 43 and the elastic portion 42 are extended in a same longitudinal direction, and the elastic portion 42 is a hollow cone which surrounds a periphery of the limiting portion 43.

It is worth of mentioning that in the present embodiment, the elastic connector 30 and the elastic supporter 40 are all made of an elastic material, such as silica gel. In addition, the positioning portion 41 of the elastic supporter 40 is interconnected with the second connecting portion 32 of the elastic connector 30. It is definitely that the positioning portion 41 of the elastic supporter 40 may be not connected with the second connecting portion 32 of the elastic connector 30. The press area 12 is formed with a positioning hole 14 on a location opposite the positioning portion 41 of the elastic supporter 40 to dispose the positioning portion 41, so that each elastic supporter 40 can be disposed in each positioning hole 14 and fixed in the press area 12 by each positioning portion 41.

Figure 2:
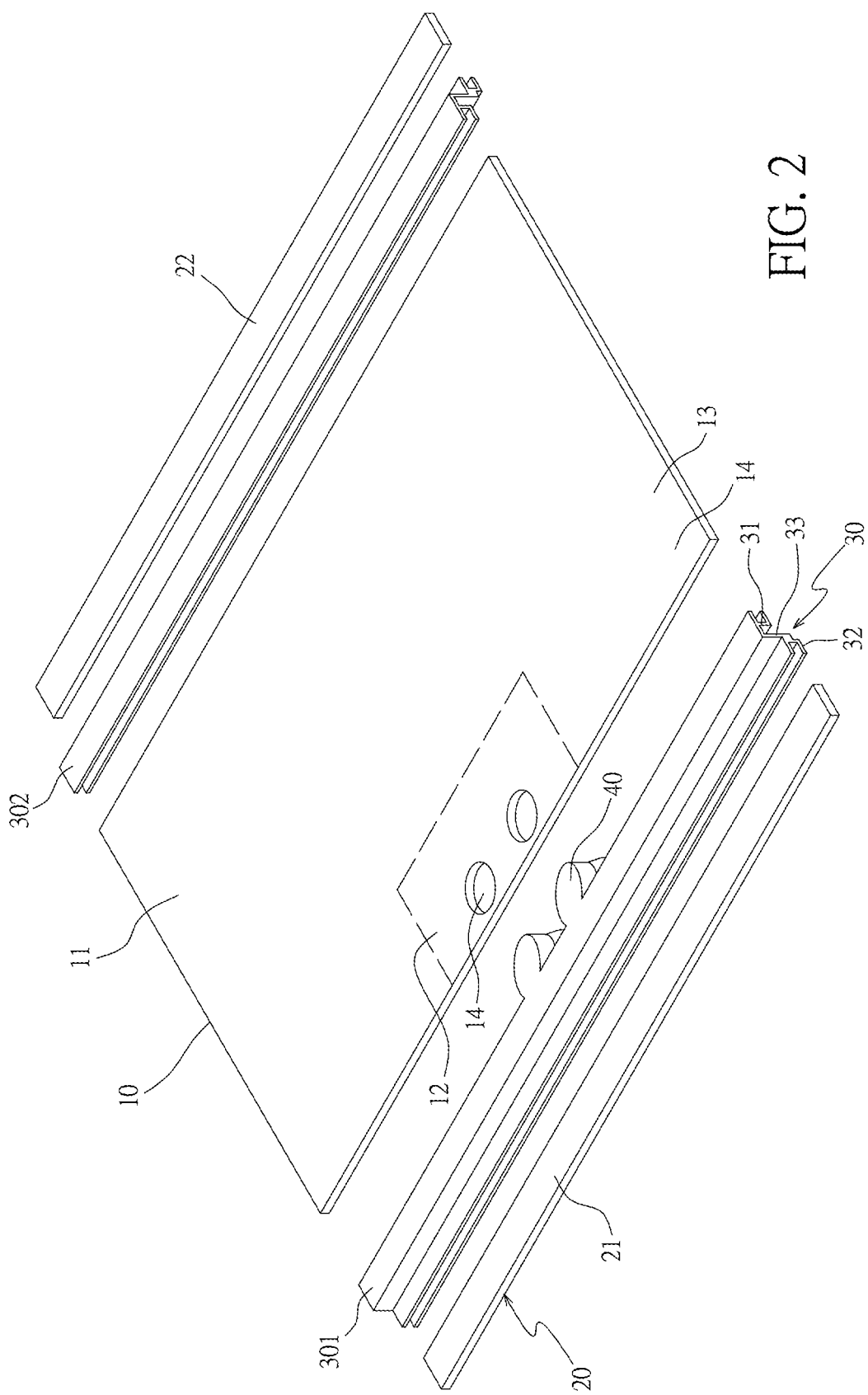
FIG. 2 shows an exploded view of a first embodiment of the present invention.
Figure 3:
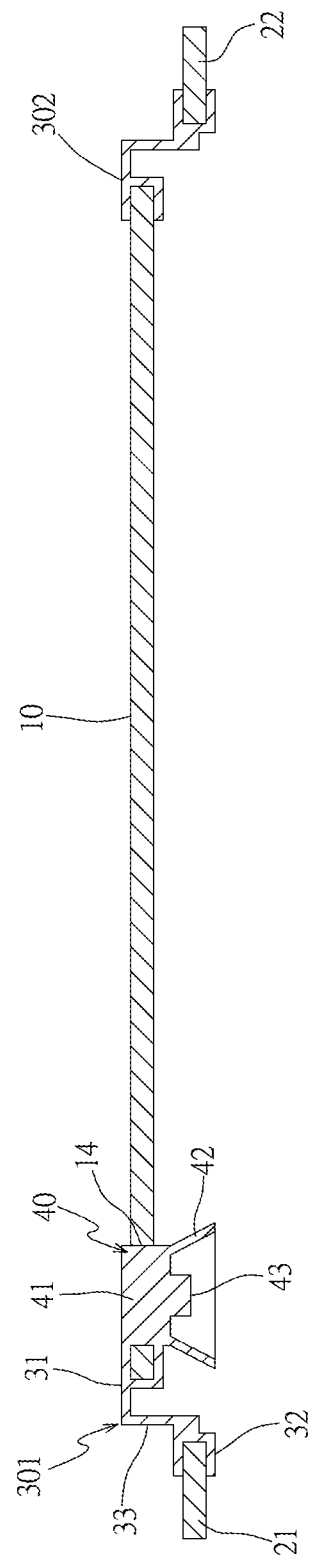
FIG. 3 shows a section view of the first mode of the present invention.
Figure 4:
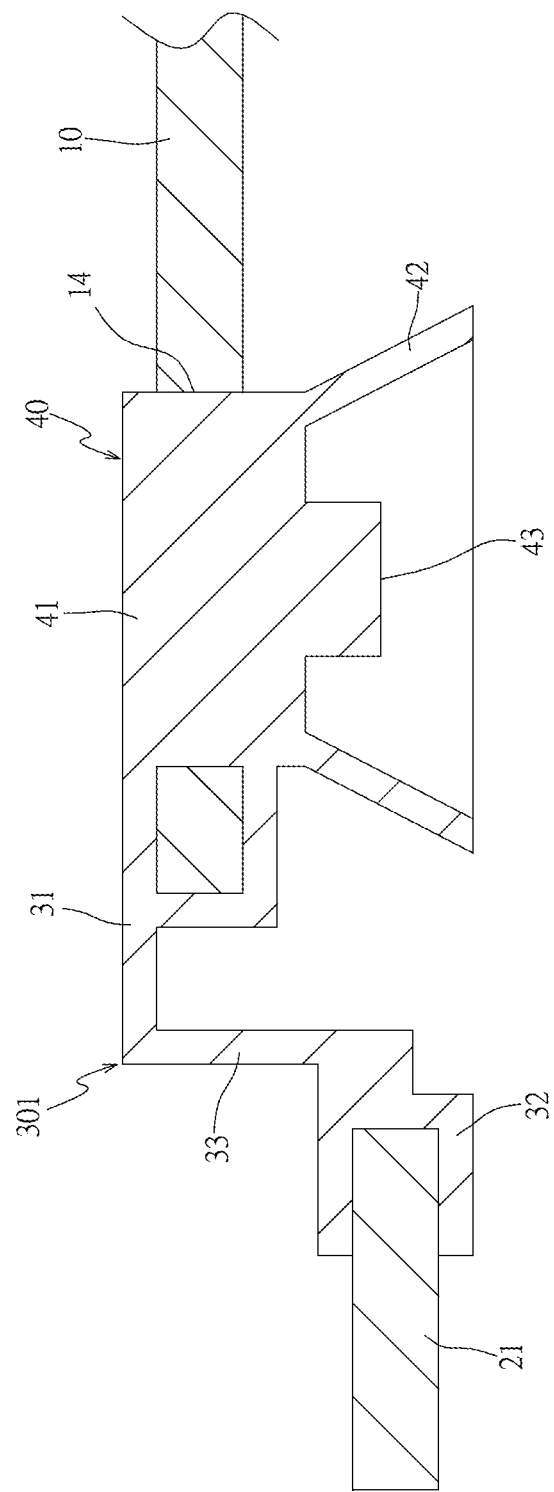
FIG. 4 shows a local expanded view of FIG. 3.
Figure 5:
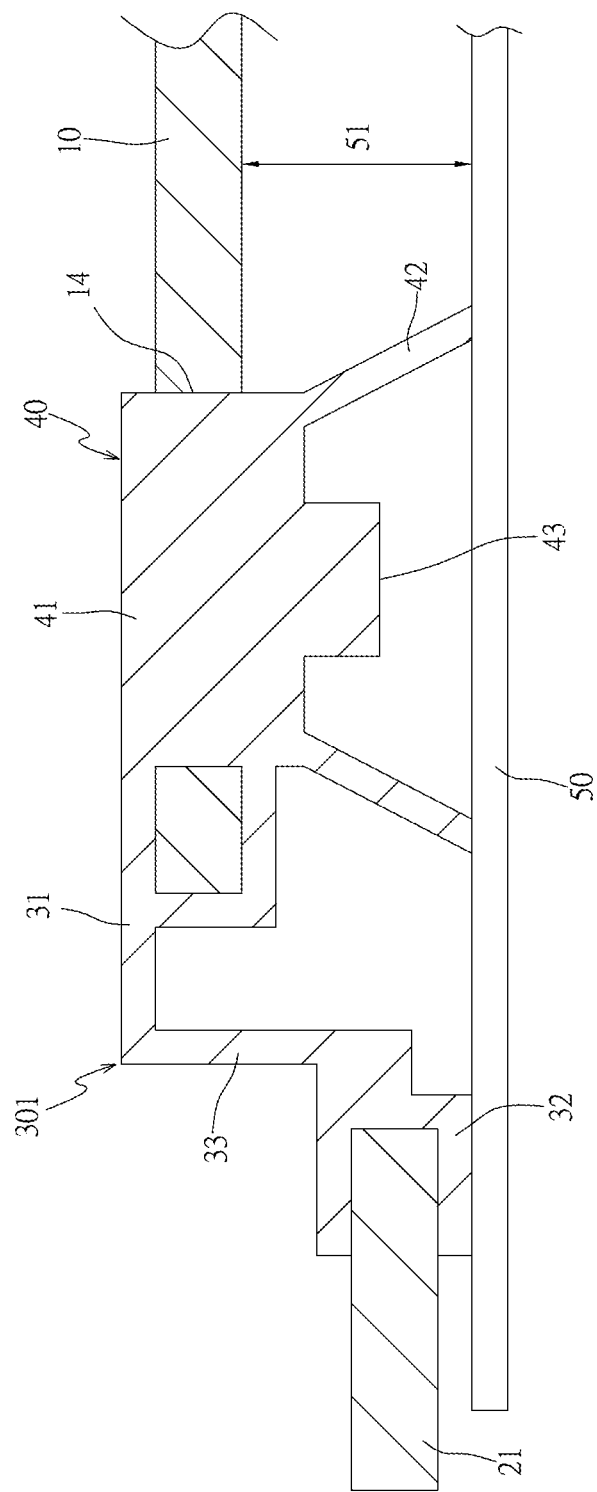
FIG. 5 shows a local expanded cutaway view of the first mode of the present invention under use.

Referring to FIG. 2, FIG. 3 and FIG. 5, when the present invention is installed on a casing 50 of a laptop computer (not shown in the drawings), it is primarily fixed on the casing 50 by the fixing element 20, which forms a gap 51 between the touch board 10 and the casing 50 using the difference in height between the casing 50 and the fixing element 20, so that the elastic portion 42 of the elastic supporter 40 and the limiting portion 43 can be disposed in the gap 51 that is formed between the touch board 10 and the casing 50. Accordingly, when the fixing element 20 is fixed on the casing 50, the press area 12 of the touch board 10 will be formed with a state of elastic vertical displacement on the casing 50 by the elastic connecting portion 33 of the elastic connector 30. Furthermore, as the press area 12 is provided with two elastic supporters 40, each elastic supporter 40 will form an elastic supporting force to the press area 12 by the elastic portion 42, which enables the press area 12 to form the state of elastic vertical displacement on the casing 50 by the elastic supporting force.

When a pressure is exerted to an upper side of the press area 12 of the touch board 10, the press area 12 will result in a downward displacement action with respect to the casing 50. At this time, the press area 12 will result in a compression state to the elastic portion 42 through the positioning portion 41 of the elastic supporter 40, and the limiting portion 43 will form a downward displacement action to the press area 12 for stopping, so that the elastic portion 42 can be accumulated with an elastic restoring force. When the pressure on the press area 12 is released, the elastic restoring force that is accumulated in the elastic portion 42 will be released at a same time, which pushes the positioning portion 41 to exert an upward displacement action to the press area 12, and results in an elastic supporting force to the press area 12. Accordingly, the press area 12 can manifest the state of elastic vertical displacement on the casing 50 by the elastic supporting force.

Accordingly, the elastic connector 30 and the elastic supporter 40 in the present invention are all formed between the touch board 10 and the fixing element 20 by elastic silica gel; therefore, when the touch board 10 displaces up and down elastically, the feel in pressing can be improved, which solves the problem in the prior arts that the feel in pressing is stiffer by the metallic spring plate, and also avoids resulting in the sound of metal by the touch button upon being pressed.

Figure 6:
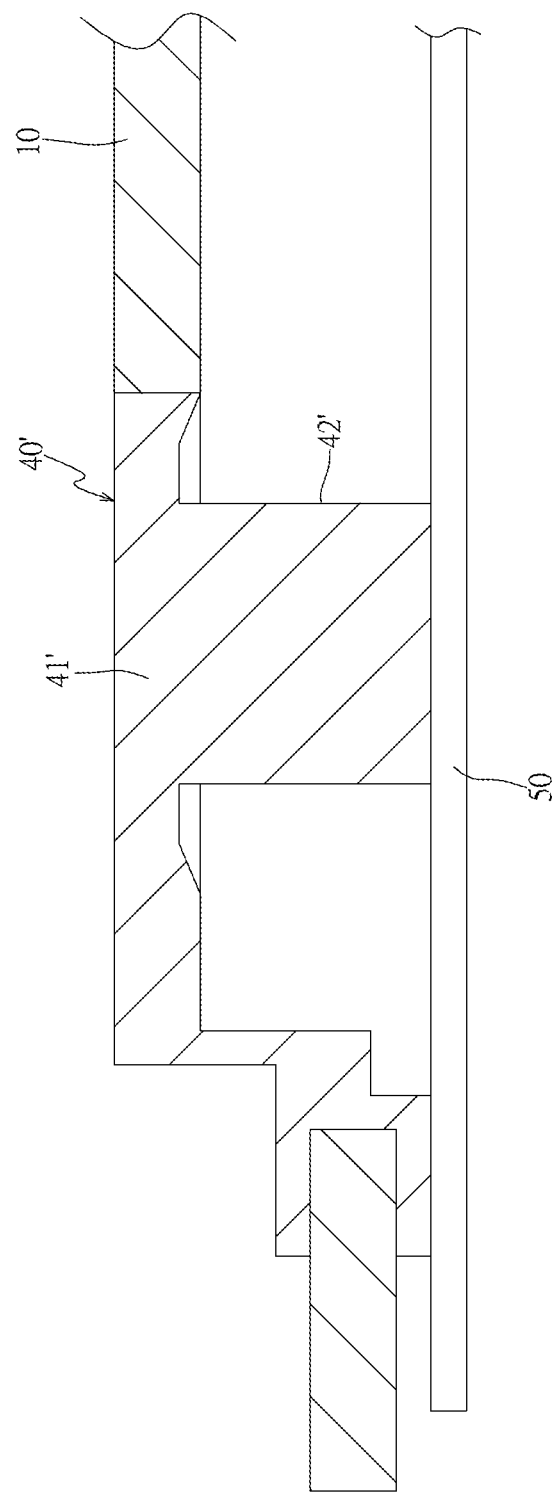
FIG. 6 shows a local expanded cutaway view of a second mode of the present invention under use.

As shown in FIG. 6, it shows a second mode of the present invention. In the present embodiment, each elastic supporter 40' is formed by a positioning portion 41' which is fixed on the touch board 10 and an elastic portion 42' which is extended from the positioning portion 41' toward the casing 50. Each elastic portion 42' is a cylinder which is extended from the positioning portion 41'. Therefore, when a pressure is exerted to an upper side of the press area 12 of the touch board 10 (as shown in FIG. 2), the cylindrical elastic portion 42' can be also accumulated with an elastic restoring force. When the pressure on the press area 12 is released, the elastic restoring force that is accumulated in the elastic portion 42' will also be released, which pushes the positioning portion 41' to result in an upward displacement action to the press area 12 and produce the elastic supporting force to the press area 12. Accordingly, the press area 12 can also manifest the state of elastic vertical displacement on the casing 50 by the elastic supporting force.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A touch button with better feel in pressing, comprising a touch board, a fixing element, a step-shaped elastic connector and an elastic supporter, wherein the touch board is provided with a touch area and a press area which is adjacent the touch area; the fixing element is disposed on a side of the touch board to form a difference in height from the touch board, is used to fix the touch board on a casing and forms a gap from the casing; the elastic connector is used to connect the touch board with the fixing element, and is provided with a first connecting portion, having a first groove, to connect the touch board, a second connecting portion, having a second groove, to connect the fixing element and an elastic connecting portion which is connected between the first connecting portion and the second connecting portion to form the difference in height between the touch board and the fixing element, forming a state of elastic vertical displacement between the press area and the casing by the elastic connecting portion; and the elastic supporter is disposed in the press area of the touch board and includes a positioning portion which is fixed on the touch board and an elastic portion which is extended from the positioning portion toward the casing to be disposed in the gap, forming an elastic supporting force to the press area by the elastic portion, so that the press area manifests a state of elastic vertical displacement on the casing by the elastic supporting force.

2. The touch button with better feel in pressing, according to claim 1, wherein the elastic portion of each elastic supporter is a cylinder.

3. The touch button with better feel in pressing, according to claim 1, wherein the elastic connector is made of an elastic material.

4. The touch button with better feel in pressing, according to claim 3, wherein the elastic material is silica gel.

5. The touch button with better feel in pressing, according to claim 1, wherein the elastic supporter is made of an elastic material.

6. The touch button with better feel in pressing, according to claim 5, wherein the elastic material is silica gel.

7. The touch button with better feel in pressing, according to claim 1, wherein the elastic portion of each elastic supporter is a hollow cone.

8. The touch button with better feel in pressing, according to claim 7, wherein each elastic supporter further includes a limiting portion which is extended from the positioning portion toward the casing, and the elastic portion is annularly disposed on a periphery of the limiting portion.

9. The touch button with better feel in pressing, according to claim 1, wherein the fixing element further includes a first board piece and a second board piece which is separated from the first board piece, the touch board is disposed between the first board piece and the second board piece, and the first board piece and the second board piece are interconnected respectively with the touch board by the elastic connector.

10. The touch button with better feel in pressing, according to claim 9, wherein the press area of the touch board is adjacent the first board piece.

11. The touch button with better feel in pressing, according to claim 10, wherein the press area is provided with plural positioning holes, and the positioning portion of each elastic supporter is disposed in each positioning hole.

12. A touch panel, comprising:
 a monolitichic touch board, the touch board comprising:
  a touch area; and
  a press area adjacent to the touch area;
 a fixing element, comprising:
  a first elongate board disposed on a first side of the touch board; and
  a second elongate board disposed on a second side of the touch board, opposite to the first side;
 a pair of elastic connectors, configured to respectively connect the first elongate board and the second elongate board to the touch board, each of the pair of elastic connectors comprising a step-shaped body having an upper portion and a lower portion, the upper portion comprising a first groove and the lower portion comprising a second groove; and
 an elastic supporter disposed in the press area and including a positioning portion fixed on the touch board,
 wherein the first elongate board and the second elongate board are respectively received within the second groove of each lower portion and the touch board is received within the first groove on the upper portion of each of the pair of elastic connectors such that the entire touch board is disposed in a plane different from that of the fixing element.

* * * * *